(12) United States Patent
Ogima et al.

(10) Patent No.: US 6,361,866 B1
(45) Date of Patent: Mar. 26, 2002

(54) PREPREG AND LAMINATED BOARD

(75) Inventors: Masahiko Ogima; Takeshi Narushima; Norio Nagai, all of Tokyo (JP)

(73) Assignees: Mitsubishi Gas Chemical Company, Inc., Tokyo (JP); The Sherwin-Williams Company, Cleveland, OH (US)

( * ) Notice: Subject to any disclaimer, the term of this patent is extended or adjusted under 35 U.S.C. 154(b) by 0 days.

(21) Appl. No.: 09/524,538

(22) Filed: Mar. 13, 2000

(30) Foreign Application Priority Data

Mar. 18, 1999 (JP) .......................................... 11-074335

(51) Int. Cl.$^7$ ........................... B32B 27/38; B32B 27/04

(52) U.S. Cl. .................... 428/413; 428/414; 428/297.4; 428/901

(58) Field of Search ................................. 428/413, 414, 428/415, 416, 417, 418, 297.4

(56) References Cited

U.S. PATENT DOCUMENTS 5,478,871 A   12/1995  Takebe et al.
5,994,429 A * 11/1999  Honda et al. ................ 523/451
6,190,787 B1 * 2/2001  Maeda et al. ................ 428/620

FOREIGN PATENT DOCUMENTS

DE      41 13 810       3/1992
EP       0 795 570      9/1997

OTHER PUBLICATIONS

Database WPI, Section Ch, Week 198318, Derwent Publications Ltd., London, GB, AN 1983–42755K—XP002141300.

* cited by examiner

Primary Examiner—Robert Dawson
Assistant Examiner—Michael J Feely
(74) Attorney, Agent, or Firm—Wenderoth, Lind & Ponack, LLP

(57) ABSTRACT

Provided are a halogen-free and phosphorus-free prepreg having good flame retardancy and having excellent electric characteristics and heat resistance, and a laminated board. The prepreg is formed of a resin composition comprising, as essential components, a phenol compound (I) having a structural unit of the formula (1),

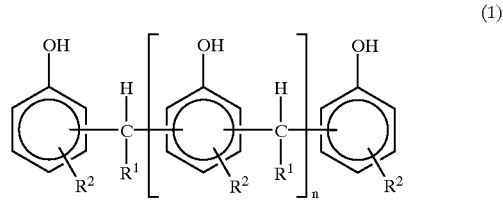

(1)

wherein $R^1$ is hydrogen or phenol, $R^2$ is a hydrogen or methyl and n is an integer of 0 to 10, an epoxy resin (II) prepared by epoxidizing the same phenol compound as said phenol compound, a metal hydrate (III) and a molybdenum compound (IV), and a substrate which is impregnated with said resin composition or to which said resin composition is applied. The laminated board for an insulating material, which is formed of the prepreg.

16 Claims, No Drawings

PREPREG AND LAMINATED BOARD

FIELD OF THE INVENTION

The present invention relates to a halogen-free prepreg formed of a resin composition having excellent flame retardancy and having good electric characteristics and heat resistance, for an insulating material, and a laminated board formed of the prepreg. The resin composition used in the present invention gives a cured product having good flame retardancy and electric characteristics and having excellent moisture absorption resistance and heat resistance and is therefore suitable for use in insulating materials. A laminated board formed of the above resin composition is halogen-free and phosphorus-free, satisfies the V-0 level of the UL standard generates neither dioxin nor phosphine during its combustion, and is therefore environmentally friendly.

PRIOR ART OF THE INVENTION

Laminated boards formed of epoxy resins as a main component are widely used as printed wiring materials for electronic machines and equipment. For flame-retarding epoxy resins, there is employed a method of using brominated epoxy resins as basic components. In recent years, it has been found that intensely toxic brominated dibenzodioxin or dibenzofuran is generated during the combustion of bromine-containing flame retardants, and regulations to be imposed on the bromine-containing flame retardants are discussed in various ways from the aspect of so-called environmental problems. As a result, in the field of thermoplastic resins, phosphorus-containing flame retardants have come to be used in place of the bromine-containing flame retardants. In the field of printed wiring materials using epoxy resins as a base material, various flame retardants to be incorporated are studied and various proposals have been made for excluding brominated epoxy resins. Methods of using phosphorus-containing flame retardants constitute the main stream in proposals presently found. However, the phosphorus-containing flame retardants not only degrade printed wiring materials to a great extent in mechanical, chemical and electrical properties, but also inevitably generate toxic gases during the combustion thereof. Under the present circumstances, there is a considerable doubt about the use of the phosphorus-containing flame retardants. It is therefore strongly desired to develop a material having excellent flame retardancy without using any one of a bromine-containing flame retardant and a phosphorus-containing flame retardant.

Flame-retardant epoxy resin laminated materials that are now available are generally fabricated by incorporating an amine-containing curing agent to a brominated epoxy resin as a base resin to obtain a varnish, impregnating a glass substrate with the varnish, semi-curing the resin under heat to obtain a prepreg and forming the prepreg into a laminate. Few flame-retardant laminated materials overcome the above environmental problems.

SUMMARY OF THE INVENTION

It is an object of the present invention to provide a halogen-free and phosphorus-free prepreg having good flame retardancy and having excellent electric characteristics and heat resistance.

According to the present invention, there is provided a prepreg formed of a resin composition comprising, as essential components, a phenol compound (I) having a structural unit of the formula (1),

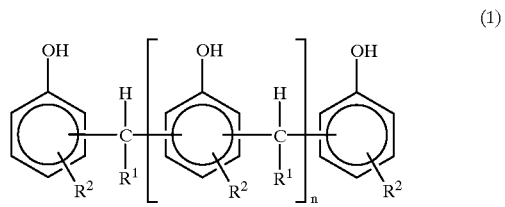

(1)

wherein $R^1$ is hydrogen or phenol, $R^2$ is a hydrogen or methyl and n is an integer of 0 to 10, an epoxy resin (II) prepared by epoxidizing the same phenol compound as said phenol compound, a metal hydrate (III) and a molybdenum compound (IV), and a substrate which is impregnated with said resin composition or to which said resin composition is applied.

According to the present invention, there is also provided a laminated board formed of the above prepreg, for an insulating material.

DETAILED DESCRIPTION OF THE INVENTION

For achieving the above object, the present inventors have made diligent studies and have found that a laminated material obtained from an epoxy resin composition containing an epoxy resin obtained from a specific phenol compound and a specific epoxy resin as a curing agent and further containing a metal hydrate and a molybdenum compound in combination has excellent flame retardancy and good electric characteristics and heat resistance. The present invention is accordingly achieved.

That is, the present invention is concerned with a prepreg formed of a resin composition comprising, as essential components, a phenol compound (I) having a structural unit of the formula (1),

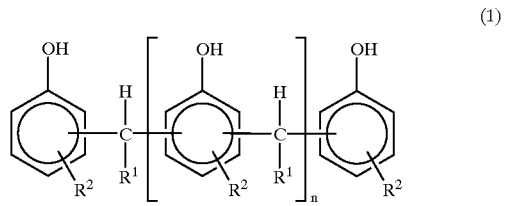

(1)

wherein $R^1$ is hydrogen or phenol, $R^2$ is a hydrogen or methyl and n is an integer of 0 to 10, an epoxy resin (II) prepared by epoxidizing said phenol compound, a metal hydrate (III) and a molybdenum compound (IV), and a substrate which is impregnated with said resin composition or to which said resin composition is applied. Further, the present invention is also concerned with a laminated board formed of the above prepreg, for an insulating material.

The phenol compound (I) used in the present invention is not specially limited so long as it is a compound having the structural unit of the formula (1). Typical examples of the phenol compound (I) include bisphenol F, phenol novolak, cresol novolak, tris(hydroxyphenyl)methane and an oligomer of tris(hydroxypheny)methane. These compounds may be used alone or in combination. Preferred are phenol novolak and an oligomer of tris(hydroxypheny)methane.

The amount of the phenol compound (I) is adjusted such that the molar ratio of phenolic hydroxyl groups to epoxy groups of the epoxy resin (II) is in the range of from 0.5 to 1.5, preferably from 0.8 to 1.2. When the above molar ratio is smaller than the above lower limit, undesirably in view of the object of the present invention, the resin composition shows very low heat resistance. When it exceeds the above upper limit, undesirably, the resin composition shows a very low humidity durability.

The epoxy resin (II) used in the present invention is not specially limited so long as it is a compound prepared by epoxidizing the same phenol compound as the phenol compound (I) having the structural unit of the formula (1). Typical examples of the epoxy resin (II) include glycidyl ethers of bisphenol F, phenol novolak, cresol novolak and tris(hydroxyphenyl)methane or derivatives of these compounds. These epoxy resins may be used alone or in combination. Preferred are glycidyl ethers of bisphenol F, phenol novolak and tris(hydroxyphenyl)methane or derivatives of these compounds.

The resin composition forming the prepreg in the present invention may contain other epoxy resin so long as the intended properties of the resin composition are not impaired. The above "other epoxy resin" can be selected from generally used epoxy resins without any special limitation. Typical examples of the other epoxy resin include glycidyl ethers of bisphenol A, bisphenol A novolak, biphenyl, polyfunctional phenol, naphthalene, alicyclic compounds, glycidyl amine resin, and glycidyl ester resins.

In the present invention, a known epoxy resin curing agent may be used in combination with the above phenol compound (I) so long as the intended properties are not impaired. The above epoxy resin curing agent can be selected from generally used epoxy resin curing agents without any special limitation. Typical examples of the epoxy resin curing agent include amine-containing compounds such as dicyandiamide, tetraethyldiaminodiphenylmethane and diaminodiphenylmethane, novolak compounds such as bisphenol A novolak, and acid anhydride compounds such as hexahydrophthalic acid anhydride. In the present invention, a curing promoter may be incorporated for adjusting the curing rate of the above resin composition as required. The curing promoter can be selected from curing promoters generally used for epoxy resins, without any special limitation. Typical examples of the curing promoter include imidazoles, derivatives thereof and tertiary amines.

The metal hydrate (III) used in the present invention is not specially limited so long as it is selected from hydrous compounds of alkali metals or alkaline earth metals. Examples of the metal hydrate (III) include aluminum hydroxide, magnesium hydroxide, a solid solution of magnesium hydroxide with zinc, nickel, calcium, aluminum or the like, and mixtures of these. These metal hydrates are those which are generally used as flame retardants for synthetic resins. The amount of the metal hydrate (III) per 100 parts by weight of the total of the phenol compound (I) and the epoxy resin (II) is 20 to 250 parts by weight, preferably 50 to 150 parts by weight. When the amount of the metal hydrate (III) is smaller than the above lower limit, there is not much effect on the improvement of flame retardancy. When it exceeds the above upper limit, the application performance of the resin composition to a substrate comes to be poor.

The molybdenum compound (IV) used in the present invention refers to a compound containing molybdenum, and it is not specially limited so long as it is selected from generally used molybdenum compounds. Examples of the molybdenum compound include molybdenum oxide, molybdenum borate, molybdenum silicate, molybdenum sulfide, zinc molybdate, calcium molybdate and ammonium molybdate. These molybdenum compounds may be used alone or in combination. Preferred is a material prepared by allowing calcium carbonate, zinc oxide or talc to support zinc molybdate (KEMGARD 911A,B,C, supplied by Sherwin-Williams). The amount of the molybdenum compound (IV) per 100 parts by weight of the total of the phenol compound (I) and the epoxy resin (II) is 0.1 to 20 parts by weight, preferably 0.5 to 10 parts by weight. When the amount of the molybdenum compound (IV) is smaller than the above lower limit, the flame retardancy is not much improved. When it exceeds the upper limit, the peel strength of a copper foil is low.

In the present invention, the resin composition may contain other flame retardant and a filler so long as the intended properties are not impaired. The above flame retardant and the above filler can be selected from those which are known and generally used.

Typical examples of the flame retardant include nitrogen-containing compounds such as melamine, benzoguanamine compound, powders of inorganic substances such as zinc borate and zinc stannate, and a silicone compound. Typical example of the filler include inorganic powders such as silica, mica, talc, glass short fibers, finely milled glass powders and hollow glass, and organic powders such as a silicone powder.

In the present invention, an organic solvent is used as required, while the organic solvent is not specially limited so long as it is compatible with the resin composition. Typical examples of the organic solvent include acetone, methyl ethyl ketone, methyl cellosolve, propylene glycol methyl ether and acetate thereof, toluene, xylene and dimethylformamide. These organic solvents may be used alone or in combination. When the impregnation of a substrate with the organic solvent is weighed, it is preferred to use solvents having boiling points of approximately 120 to 200° C. in combination.

In the present invention, the resin composition may contain an ultraviolet absorbent, an antioxidant, a photopolymerization initiator and a fluorescence brightener so long as the intended properties are not impaired. These are not specially limited so long as they are known and can be generally used. Typical examples thereof include ultraviolet absorbents such as a benzotriazole-containing compound, antioxidants such as a hindered phenol-containing antioxidant and styrenated phenol, photopolymerization initiators such as a thioxanthone compound, and fluorescence brighteners such as a stilbene derivative.

The resin composition containing, as essential components, the phenol compound (I), the epoxy resin (II), the metal hydrate (III) and the molybdenum compound (IV) is applied to a substrate, or a substrate is impregnated with the above resin composition, and the resin composition is B-staged by heating, whereby the prepreg of the present invention is produced. The substrate used in the present invention can be selected from those substrates which are known and generally used in various laminated boards as electrically insulating substrates. Typical examples of materials for the substrate include inorganic fibers of E, D, S and Q glasses, organic fibers of polyimide, polyester and tetrafluoroethylene, and fibers of mixtures of these. The substrate includes a woven fabric, a non-woven fabric, a roving, a chopped strand mat and a surfacing mat if classified on the basis of its forms. The material and the form are properly selected depending upon use and performances of an intended laminated product. The above materials may be used alone or in combination, and the above forms may be employed alone or in combination, as required. Although not specially limited, the substrate generally has a thickness of approximately 0.03 to 0.5 mm. Further, it is preferred to surface-treat the substrate with a silane coupling agent or mechanically open the substrate, from the aspect of resistance against moisture absorption and heat. Concerning the amount of the resin composition adhering to the substrate, the prepreg after dried has a resin content of 20 to 90% by weight. After the substrate is impregnated with the resin composition, or the resin composition is applied to the substrate, the prepreg of the present invention is obtained by a method in which the resin composition is generally heated in a dryer having a temperature of 100 to 200° C. for 1 to 30 minutes, to semi-cure (B-stage) the resin composition.

The laminated board of the present invention is obtained by laminate-forming the above prepreg of the present invention. Specifically, a plurality of prepreg sheets are stacked as required, a metal foil such as a copper or aluminum foil is placed on one surface, a metal foil is optionally placed on the other surface, and the so-structured set is formed into a laminate, whereby a laminated board is obtained. The metal foil is not specially limited so long as they are those which are used in the field of general printed wiring board. The above laminate-formation is carried out under conditions employed for forming general laminated boards and multi-layered boards used as insulation materials. For example, the laminate-formation is carried out with a multi-platen press, a multi-platen vacuum press, a continuous-forming machine or an autoclave forming machine at a temperature of 100 to 250° C. under a pressure of 2 to 100 kg/cm$^2$ for a heating time period of 0.03 to 3 hours. Further, the prepreg of the present invention and a separately prepared printed wiring board for an internal layer may be combined and formed together into a laminate, whereby a multi-layered board can be obtained.

EXAMPLES

82 Parts by weight of a bisphenol F type epoxy resin (Epikote 4001P, epoxy equivalent: 480, supplied by Yuka-Shell Epoxy K.K.) and 18 parts by weight of a phenol novolak resin (TD2090, softening point: 120° C., hydroxyl equivalent: 105, supplied by Dainippon Ink & Chemicals, Inc.) were dissolved in methyl ethyl ketone, and then, 100 parts by weight of aluminum hydroxide (CL310, supplied by Sumitomo Chemical Co., Ltd.), 10 parts by weight of a material prepared by allowing talc to support zinc molybdate (KEMGARD 911C, supplied by Sharwin-Williams) and 0.05 part by weight of 2-ethyl-4-methylimidazole were mixed with the above solution, to obtain a varnish. The varnish was diluted with methyl ethyl ketone, and the diluted varnish was applied to an E glass cloth having a thickness of 0.1 mm to impregnate the E glass cloth with the varnish. The varnish was dried under heat at 150° C. for 5 minutes to give a prepreg having a resin content of 44% by weight. Eight sheets from the prepreg were stacked, 35 μm thick electrolytic copper foils were placed on upper and lower surfaces one each, and the resultant set was pressed under a pressure of 30 kg/cm2 at a temperature of 175° C. for 120 minutes, to give a copper-clad laminated board. The copper-clad laminated board was measured for physical properties (durability against soldering heat, peel strength and flame retardancy) by the following methods. Table 1 shows the results.

Durability against solder heat and peel strength: Measured according to JIS C6481

Flame retardancy: Measured according to UL 94 vertical combustion test.

Example 2

64 Parts by weight of a phenol novolak epoxy resin (Epikote 154, epoxy equivalent: 178, supplied by Yuka-Shell Epoxy K.K.) and 36 parts by weight of an oligomer of tris(hydroxyphenyl)methane (Epicure YL6065, softening point: 98° C., hydroxyl equivalent: 125, supplied by Yuka-Shell Epoxy K.K.) were dissolved in xylen, and then, 150 parts by weight of aluminum hydroxide (CL310), 5 parts by weight of a material prepared by allowing talc to support zinc molybdate (KEMGARD 911C) and 0.02 part by weight of dimethylbenzylamine were mixed with the above solution, to obtain a varnish. Thereafter, a copper-clad laminated board was prepared in the same manner as in Example 1 except that the varnish used in Example 1 was replaced with the above varnish. The copper-clad laminated board was measured for physical properties, and Table 1 shows the results.

Example 3

35 Parts by weight of a bisphenol F type epoxy resin (Epikote 4001P), 33 parts by weight of a phenol novolak epoxy resin (Epikote 154) and 32 parts by weight of a phenol novolak resin (TD2131, softening point: 80° C., hydroxyl equivalent: 103, supplied by Dainippon Ink & Chemicals, Inc.) were dissolved in methyl ethyl ketone, and then 50 parts by weight of aluminum hydroxide (CL310), 20 parts by weight of a material prepared by allowing talc to support zinc molybdate (KEMGARD 911C) and 0.03 part by weight of 2-ethyl-4-methylimidazole were mixed with the above solution, to obtain a varnish. Thereafter, a copper-clad laminated board was prepared in the same manner as in Example 1 except that the varnish used in Example 1 was replaced with the above varnish. The copper-clad laminated board was measured for physical properties, and Table 1 shows the results.

Example 4

80 Parts by weight of a bisphenol F type epoxy resin (Epikote 4001P), 10 parts by weight of a phenol novolak resin (TD2090) and 10 parts by weight of an oligomer of tris(hydroxyphenyl)methane (Epicure YL6065) were dissolved in methyl ethyl ketone, and then, 80 parts by weight of aluminum hydroxide (CL310), 20 parts by weight of magnesium hydroxide (VD650, supplied by Ube Material), 10 parts by weight of a material prepared by allowing talc to support zinc molybdate (KEMGARD 911C) and 0.04 part by weight of 2-ethyl-4-methylimidazole were mixed with the above solution, to obtain a varnish. Thereafter, a copper-clad laminated board was prepared in the same manner as in Example 1 except that the varnish used in Example 1 was replaced with the above varnish. The copper-clad laminated board was measured for physical properties, and Table 1 shows the results.

Example 5

55 Parts by weight of a bisphenol F type epoxy resin (Epikote 4001P), 20 parts by weight of a triphenyl-methane-based epoxy resin (Epikote 1032, epoxy equivalent: 169, supplied by Yuka-Shell Epoxy K.K.), 15 parts by weight of a phenol novolak resin (TD2090) and 10 parts by weight of an oligomer of tris(hydroxyphenyl)methane (Epicure YL6065) were dissolved in methyl ethyl ketone, and then, 100 parts by weight of aluminum hydroxide (CL310), 10 parts by weight of a material prepared by allowing talc to support zinc molybdate (KEMGARD 911C) and 0.02 part by weight of 2-ethyl-4-methylimidazole were mixed with the above solution, to obtain a varnish. Thereafter, a copper-clad laminated board was prepared in the same manner as in Example 1 except that the varnish used in Example 1 was replaced with the above varnish. The copper-clad laminated board was measured for physical properties, and Table 1 shows the results.

Example 6

45 Parts by weight of a bisphenol F type epoxy resin (Epikote 4001P), 30 parts by weight of a cresol novolak epoxy resin (ESCN220, epoxy equivalent: 212, supplied by Sumitomo Chemical Co., Ltd.) and 25 parts by weight of a phenol novolak resin (TD2131) were dissolved in methyl ethyl ketone, and then, 70 parts by weight of aluminum hydroxide (CL310), 30 parts by weight of magnesium hydroxide (VD650), 10 parts by weight of a material prepared by allowing talc to support zinc molybdate (KEMGARD 911C) and 0.03 part by weight of dimethyl-benzylamine were mixed with the above solution, to obtain a varnish. Thereafter, a copper-clad laminated board was prepared in the same manner as in Example 1 except that the varnish used in Example 1 was replaced with the above varnish. The copper-clad laminated board was measured for physical properties, and Table 1 shows the results.

Example 7

50 Parts by weight of a phenol novolak epoxy resin (Epikote 154), 20 parts by weight of a bisphenol A type epoxy resin (Epikote 1001, epoxy equivalent: 480, supplied by Yuka-Shell Epoxy K.K.), 29 parts by weight of a phenol novolak resin (TD2090) and 1 part by weight of dicyandiamide were dissolved in dimethylformamide, and then, 100 parts by weight of aluminum hydroxide (CL310), 10 parts by weight of a material prepared by allowing talc to support zinc molybdate (KEMGARD 911C), 3 parts by weight of zinc borate (FRC500, supplied by Mizuzawa Kagaku) and 0.04 part by weight of 2-ethyl-4-methylimidazole were mixed with the above solution, to obtain a varnish. Thereafter, a copper-clad laminated board was prepared in the same manner as in Example 1 except that the varnish used in Example 1 was replaced with the above varnish. The copper-clad laminated board was measured for physical properties, and Table 1 shows the results.

Comparative Example 1

82 Parts by weight of a bisphenol A type epoxy resin (Epikote 1001) and 18 parts by weight of a phenol novolak resin (TD2131) were dissolved in methyl ethyl ketone, and then, 100 parts by weight of aluminum hydroxide CL310), 10 parts by weight of a material prepared by allowing talc to support zinc molybdate (KEMGARD 911C) and 0.03 part by weight of 2-ethyl-4-methylimidazole were mixed with the above solution, to obtain a varnish. Thereafter, a copper-clad laminated board was prepared in the same manner as in Example 1 except that the varnish used in Example 1 was replaced with the above varnish. The copper-clad laminated board was measured for physical properties, and Table 1 shows the results.

Comparative Example 2

60 Parts by weight of a phenol novolak epoxy resin (Epikote 154) and 40 parts by weight of a bisphenol A novolak resin (VH4150, softening point: 87° C., hydroxyl equivalent: 120, supplied by Dainippon Ink & Chemicals, Inc.) were dissolved in methyl ethyl ketone, and then, 100 parts by weight of aluminum hydroxide (CL310), 10 parts by weight of a material prepared by allowing talc to support zinc molybdate (KEMGARD 911C) and 0.04 part by weight of 2-ethyl-4-methylimidazole were mixed with the above solution, to obtain a varnish. Thereafter, a copper-clad laminated board was prepared in the same manner as in Example 1 except that the varnish used in Example 1 was replaced with the above varnish. The copper-clad laminated board was measured for physical properties, and Table 1 shows the results.

Comparative Example 3

A varnish was prepared in the same manner as in Example 1 except that the aluminum hydroxide was replaced with talc (P-2, supplied by Nippon Talc). Thereafter, a copper-clad laminated board was prepared in the same manner as in Example 1 except that the varnish used in Example 1 was replaced with the above varnish. The copper-clad laminated board was measured for physical properties, and Table 1 shows the results.

Comparative Example 4

A varnish was prepared in the same manner as in Example 1 except that the material prepared by allowing talc to support zinc molybdate (KEMGARD 911C) was not used. Thereafter, a copper-clad laminated board was prepared in the same manner as in Example 1 except that the varnish used in Example 1 was replaced with the above varnish. The copper-clad laminated board was measured for physical properties, and Table 1 shows the results.

TABLE 1

|  | Copper foil peel strength (kg/cm) | Insulation resistance (D-6/100) | Tg (DMA method) (° C.) | Flame retardancy (UL94 method) |
|---|---|---|---|---|
| Ex. 1 | 1.8 | $6 \times 10^{12}$ | 144 | V-0 |
| Ex. 2 | 1.5 | $1 \times 10^{13}$ | 186 | V-0 |
| Ex. 3 | 1.7 | $3 \times 10^{12}$ | 160 | V-0 |
| Ex. 4 | 1.8 | $4 \times 10^{12}$ | 149 | V-0 |
| Ex. 5 | 1.6 | $6 \times 10^{12}$ | 173 | V-0 |
| Ex. 6 | 1.7 | $7 \times 10^{12}$ | 163 | V-0 |
| Ex. 7 | 1.8 | $2 \times 10^{12}$ | 177 | V-0 |
| CEx. 1 | 1.8 | $2 \times 10^{12}$ | 134 | Combusted |
| CEx. 2 | 1.5 | $4 \times 10^{12}$ | 168 | V-0 |
| CEx. 3 | 0.8 | $5 \times 10^{12}$ | 145 | combusted |
| CEx. 4 | 1.9 | $2 \times 10^{12}$ | 142 | V-0 |

Ex. = Example, CEx. = Comparative Example

According to the present invention, there is provided a prepreg for an insulating material, which prepreg is obtained from a halogen-free resin composition having excellent flame retardancy and having good electric characteristics and heat resistance, and which prepreg generates no dioxin, etc., during combustion, and a laminated board.

What is claimed is:
1. A prepreg formed of a resin composition comprising, as essential components, a phenol compound (I) having a structural unit of the formula (1),

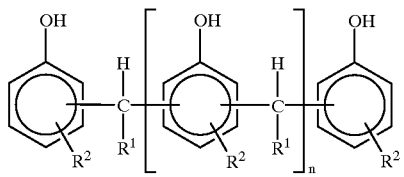

(1)

wherein $R^1$ is hydrogen or phenol, $R^2$ is a hydrogen or methyl and n is an integer of 0 to 10, an epoxy resin (II) prepared by epoxidizing the same phenol compound as said phenol compound, a metal hydrate (III) and a molybdenum compound (IV), and a substrate which is impregnated with said resin composition or to which said resin composition is applied, wherein the resin composition has a metal hydrate (III) content of 50 to 150 parts by weight per 100 parts by weight of the total of the epoxy resin (II) and the phenol compound (I).

2. The prepreg according to claim 1, wherein the metal hydrate (III) is at least one member selected from the group consisting of aluminum hydroxide, magnesium hydroxide and derivatives of these.

3. The prepreg according to claim 1, wherein the molybdenum compound (IV) is zinc molybdate.

4. The prepreg according to claim 1, wherein the phenol compound (I) is phenol novolak, an oligomer of tris(hydroxyphenyl)methane or a mixture of these.

5. The prepreg according to claim 1, wherein the epoxy resin (II) is a product prepared by epoxidizing bisphenol F, phenol novolak, tris(hydroxyphenyl)methane or an oligomer of tris(hydroxyphenyl)methane or a mixture of any two epoxidized products of these.

6. The prepreg according to claim 1, wherein the resin composition has a molybdenum compound (IV) content of 0.1 to 20 parts by weight per 100 parts by weight of the total of the epoxy resin (II) and the phenol compound (I).

7. The prepreg according to claim 1, wherein the molar ratio of phenolic hydroxyl groups of the phenol compound (I) to epoxy groups of the epoxy resin (II) is in the range of from 0.5 to 1.5.

8. The prepreg according to claim 1 consisting essentially of said components (I)–(IV).

9. A laminated board for an insulating material, which is obtained by laminate-forming a prepreg formed of a resin composition comprising, as essential components, a phenol compound (I) having a structural unit of the formula (1),

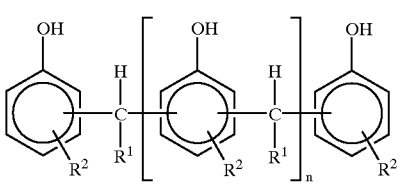

(1)

wherein $R^1$ is hydrogen or phenol, $R^2$ is a hydrogen or methyl and n is an integer of 0 to 10, an epoxy resin (II) prepared by epoxidizing the same phenol compound as said phenol compound, a metal hydrate (III) and a molybdenum compound (IV), and a substrate which is impregnated with said resin composition or to which said resin composition is applied.

10. The laminated board according to claim 9 wherein the metal hydrate (III) is at least one member selected from the group consisting of aluminum hydroxide, magnesium hydroxide and derivatives thereof.

11. The laminated board according to claim 9 wherein the molybdenum compound (IV) is zinc molybdate.

12. The laminated board according to claim 9 wherein the phenol compound (I) is phenol novolak, an oligomer of tris(hydroxyphenyl)methane or a mixture of these.

13. The laminated board according to claim 9 wherein the epoxy resin (II) is a product produced by epoxidizing bisphenol F, phenol novolak, tris(hydroxyphenyl)methane or an oligomer of tris(hydroxyphenyl)methane or a mixture of any two epoxidized products of these.

14. The laminated board according to claim 9 wherein the resin composition has a molybdenum compound (IV) of 0.1 to 20 parts by weight per 100 parts by weight of the total epoxy resin (II) and the phenol compound (I).

15. The laminated board according to claim 9 wherein the molar ratio of phenolic hydroxyl groups of the phenol compound (I) to epoxy groups of the epoxy resin (II) is in the range of from 0.5 to 1.5.

16. The laminated board according to claim 9 wherein said prepreg consists essentially of said components (I)–(IV).

* * * * *